United States Patent [19]

Chan

[11] Patent Number: 5,442,185

[45] Date of Patent: Aug. 15, 1995

[54] LARGE AREA ION IMPLANTATION PROCESS AND APPARATUS

[75] Inventor: Chung Chan, Newton, Mass.

[73] Assignee: Northeastern University, Boston, Mass.

[21] Appl. No.: 353,098

[22] Filed: Dec. 9, 1994

Related U.S. Application Data

[62] Division of Ser. No. 230,327, Apr. 20, 1994.

[51] Int. Cl.6 .......................................... H01J 37/317
[52] U.S. Cl. ............................ 250/492.21; 250/423 R; 250/291
[58] Field of Search ............. 250/492.21, 492.2, 492.3, 250/396 R, 398, 423 R, 281, 282, 283, 288, 290, 291; 315/111.41, 111.71

[56] References Cited

U.S. PATENT DOCUMENTS

| | | | |
|---|---|---|---|
| 3,571,734 | 3/1971 | Consoli et al. | |
| 4,139,772 | 2/1979 | Williams | 250/423 R |
| 4,587,430 | 5/1986 | Adler | 250/423 R |
| 5,144,196 | 9/1992 | Gegenwart et al. | 315/111.41 |
| 5,232,569 | 8/1993 | Nelson et al. | 204/192.15 |
| 5,289,010 | 2/1994 | Shohet | 250/492.21 |

*Primary Examiner*—Jack I. Berman
*Assistant Examiner*—James Beyer
*Attorney, Agent, or Firm*—Weingarten, Schurgin, Gagnebin & Hayes

[57] ABSTRACT

A large area ion implantation apparatus which selects ions having predetermined characteristics for implantation. The ions having predetermined characteristics are selected from a plasma contained within a magnetic bottle and heated by a radio frequency source. The selected ions in one embodiment escape from the magnetic bottle and bombard a substrate located external to the magnetic bottle. In another embodiment the selected ions are retained within the magnetic bottle and bombard a substrate which is also located within the bottle. In yet another embodiment of the apparatus, a positive potential on an electrostatic grid located between the substrate and the plasma prevents ions from bombarding a substrate maintained at a negative potential until the potential on the grid is reduced to approximately zero volts.

24 Claims, 7 Drawing Sheets

LARGE AREA ION IMPLANTATION PROCESS AND APPARATUS

CROSS REFERENCE TO RELATED APPLICATIONS

This is a division of application Ser. No. 08/230,327, filed Apr. 20, 1994.

FIELD OF THE INVENTION

The invention relates generally to the field of ion implantation devices and specifically to ion implantation devices utilizing plasma immersion.

BACKGROUND OF THE INVENTION

Ion implantation is used in semiconductor wafer fabrication to add impurities (ions having certain electronic characteristics) to a substrate. One form of ion implantation apparatus utilizes an ion beam which is scanned over the surface of the wafer. The ions of the beam are produced with sufficient energy that they are implanted into the wafer material. The problem with this method of ion implantation is that the amount of time it takes to scan an ion beam over the surface of a wafer increases significantly as the wafer area increases.

A second method used for large wafer ion implantation is termed plasma immersion. In this method, a wafer is positioned within a plasma and is pulse biased to a highly negative voltage. The ions of the plasma bombard the wafer and are implanted. The problem associated with this method is that the ions of the plasma which bombard the wafer have a distribution of energies and as a result the ions which are implanted penetrate into the wafer to various depths. This results in a non-uniform implantation layer. Furthermore, this method has no control over the composition of the ion species implanted since all of the positive ion species in the plasma will be implanted. To avoid these undesirable effects, the energy distribution of the ions bombarding the substrate must be controlled and the composition of the ion species for implantation must be limited.

SUMMARY OF THE INVENTION

The invention relates to an ion implantation device for implanting a wafer with ions having certain predetermined characteristics. A magnetic bottle is used to hold a plasma from which the ions to be implanted are selected. A radio frequency source heats certain ions of the plasma selectively. Depending upon the ions chosen for implantation and the embodiment of the implantation apparatus, these ions are either retained within the magnetic bottle or permitted to escape from the magnetic bottle. If the ions retained within the magnetic bottle are to be selected for implantation, the substrate to be implanted is positioned within the magnetic bottle. If the ions which are permitted to escape from the magnetic bottle are to be selected for implantation, the substrate to be implanted is positioned external to the magnetic bottle.

In one embodiment, the ion implantation apparatus includes a magnetic bottle for selectively retaining ions, an ion cyclotron resonant frequency device for selectively heating ions retained within the magnetic bottle and a substrate holder positioned to expose a substrate to ions selectively retained within the magnetic bottle. Ions not having the required predetermined characteristics are permitted to escape from the magnetic bottle. Those ions which are selectively retained within the bottle bombard the substrate, thereby exposing the substrate primarily to those ions having the required predetermined characteristics.

In a second embodiment the ion implantation apparatus includes a magnetic bottle for selectively retaining ions, a ion cyclotron resonant frequency device for selectively heating ions retained within the magnetic bottle and a substrate holder positioned to expose a substrate to ions which escape from the magnetic bottle. Ions having predetermined characteristics are permitted to escape from the magnetic bottle. Ions which are selectively permitted to escape from the magnetic bottle bombard the substrate thereby exposing the substrate primarily to those ions having the required predetermined characteristics.

In yet another embodiment of the ion implantation apparatus, an electrostatic grid is positioned between the plasma and the wafer holder. The wafer holder is maintained at a large negative potential relative to the potential of the plasma. The electrostatic grid is periodically set to a positive potential greater than the potential of the plasma and periodically set to zero potential. When the grid is set to the positive potential, the positive ions of the plasma are prevented from reaching the wafer. When the grid is set to zero potential the positive ions of the plasma are accelerated by the high negative potential of the wafer holder and are implanted into the wafer to a desired depth.

The invention also relates to a method of ion implantation by exposing a substrate to implantation ions having certain predetermined characteristics.

In one embodiment, the method includes the steps of selectively retaining ions within a magnetic bottle and selectively heating the ions retained within the magnetic bottle with a ion cyclotron resonant frequency device. Ions which do not have predetermined characteristics are permitted to escape from the magnetic bottle. A substrate is exposed to ions having predetermined characteristics which are selectively retained within the magnetic bottle.

In another embodiment the method includes the steps of selectively retaining ions within a magnetic bottle, selectively heating ions retained within the magnetic bottle with a ion cyclotron resonant frequency device, thereby permitting ions having predetermined characteristics to escape from the magnetic bottle, and exposing a substrate to ions having predetermined characteristics which escape from the magnetic bottle.

In yet another embodiment, the method includes the steps of placing an electrostatic grid between the plasma and the wafer holder, maintaining the wafer holder at a large negative potential relative to the potential of the plasma, periodically setting the electrostatic grid to a positive potential greater than the potential of the plasma, periodically setting the electrostatic grid to zero potential and exposing a substrate to positive ions which are accelerated by the negative potential on the substrate holder when the electrostatic grid is set to zero potential.

DESCRIPTION OF THE DRAWINGS

This invention is pointed out with particularity in the appended claims. The above and further advantages of this invention may be better understood by referring to the following description taken in conjunction with the accompanying drawing, in which:

DETAILED DESCRIPTION OF THE INVENTION

Figure 1:
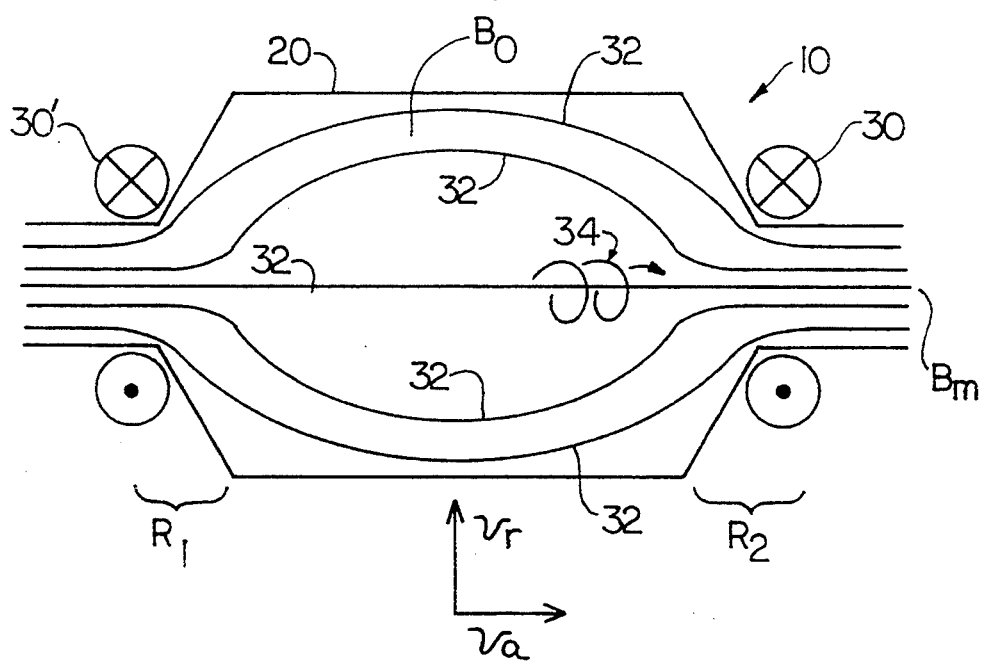
FIG. 1 is an embodiment of a magnetic bottle known to the prior art.

Plasma containment devices termed magnetic bottles are well known to the prior art. Referring to FIG. 1, a magnetic bottle 10 typically consists of an elongated vacuum chamber 20 with a toroidal electromagnet 30, 30' located at each end. The two toroidal electromagnets 30, 30' develop a magnetic field 32 within the vacuum chamber 20. The magnetic field 32 has the highest field density $B_m$ at the regions of convergence $R_1$, $R_2$ adjacent the electromagnets 30, 30' compared to the field density $B_o$, in the region between the electromagnets 30, 30'.

A plasma is either created within the magnetic bottle 10 or injected into the magnetic bottle 10. Ions of the plasma located within the magnetic bottle 10 move from one end of the magnetic bottle 10 to the other end by spiraling or gyrating 34 along the field lines 32. These ions have a velocity v which has a radial velocity component $v_r$ perpendicular to the field line 32 and an axial velocity component $v_a$ parallel to the field line 32.

Ions with ratios of $v_r$ to $v_a$ above a certain value, which is determined by the charge and mass of the ion, are reflected by the converging magnetic field regions $R_1$, $R_2$ back toward the center of the magnetic bottle 10. These regions of converging magnetic field which cause an ion spiraling down the magnetic field lines to reverse direction are termed mirror points for the ions. Ions which are reflected back and forth between the mirror points are effectively trapped within the magnetic bottle 10. Magnetic bottles 10 typically are used to contain plasmas at elevated temperatures and densities for studies relating to space science and nuclear fusion.

A problem that has plagued the users of magnetic bottles is the bottles' tendency to leak or permit ions to escape. Ions within the plasma trapped within a magnetic bottle experience an ambipolar potential arising from the presence of the large number of ions contained within a confined volume. This ambipolar potential causes the ions to drift along the magnetic field lines away from each other. A magnetic bottle may leak in several ways and fail to contain these drifting ions. A magnetic bottle 10 may leak by permitting ions, which should gyrate about a field line 32, to drift across field lines in a direction perpendicular to the magnetic field 32 and make contact with the walls of the vacuum chamber 20. This occurs for example, when the operating pressure is high and ion-neutral particle collisions cause ion drift motion perpendicular to the magnetic field lines.

Alternatively, ions with ratios of $v_r$ to $v_a$ below a certain value are not reflected by the mirror points at the ends of the magnetic bottle 10 and escape from the ends of the magnetic bottle 10. It is this second type of leakage that is exploited by the ion implantation apparatus of the invention.

Specifically, an ion will be trapped between the mirror points if the following condition holds:

$$\frac{v_r^2}{v_0^2} \geq \sin^2\theta_m = \frac{B_0}{B_m} = \frac{1}{R_m}$$

where $v_r$ is the radial velocity component of the ion at the midplane of the magnetic bottle; $v_a$ is axial velocity component of the ion at the midplane of the magnetic bottle; $v_o$ is the total velocity of the ion at the midplane of the magnetic bottle (where $v_p$ is defined by the expression $v_2^2 = v_a^2 + v_r^2$) $B_o$ is the magnetic field at the midplane of the magnetic bottle; $B_m$ is the maximum B field at the regions of convergence; $\theta_m$ is the maximum pitch angle (defined as $\text{Tan}^{-1}(v_r/v_a)$) and $R_m$, the mirror ratio (defined as $B_m/B_o$). An individual ion is therefore trapped within the magnetic bottle if its radial velocity component, $v_r$, satisfies the following condition.

$$v_r \geq \sqrt{\frac{1}{R_m} - 1} \; |v_a|$$

Although the above expression holds for a single ion, a large number of particles in a plasma, each of mass M, may be considered statistically as having temperature components $T_\perp$ (perpendicular temperature) and $T_\mu$ (parallel temperature) which correspond to the velocity components of the individual particles perpendicular ($v_r$) to and parallel ($v_a$) to, respectively, the field lines of the magnetic bottle. For a plasma having a particle density (n), a Maxwellian distribution of particle velocities, and a parallel drift velocity, $v_{d\mu}$, (caused by the ambipolar potential described previously), the density of the particles trapped within the confines of the magnetic bottle ($n_T$) is given by the expression:

$$n_T = \frac{n}{(a_m + 1)^{\frac{1}{2}}} e^{\frac{-am(vd_\parallel)^2}{2am+1}}$$

where $$a_m = \frac{T_\parallel / T_\perp}{R_m - 1}$$

and $$\langle v_{d\parallel} \rangle = \frac{v_{d\parallel}\sqrt{M}}{\sqrt{T_\parallel}}$$

where ($v_{d\mu}$) is the average parallel drift velocity.

Figure 2:
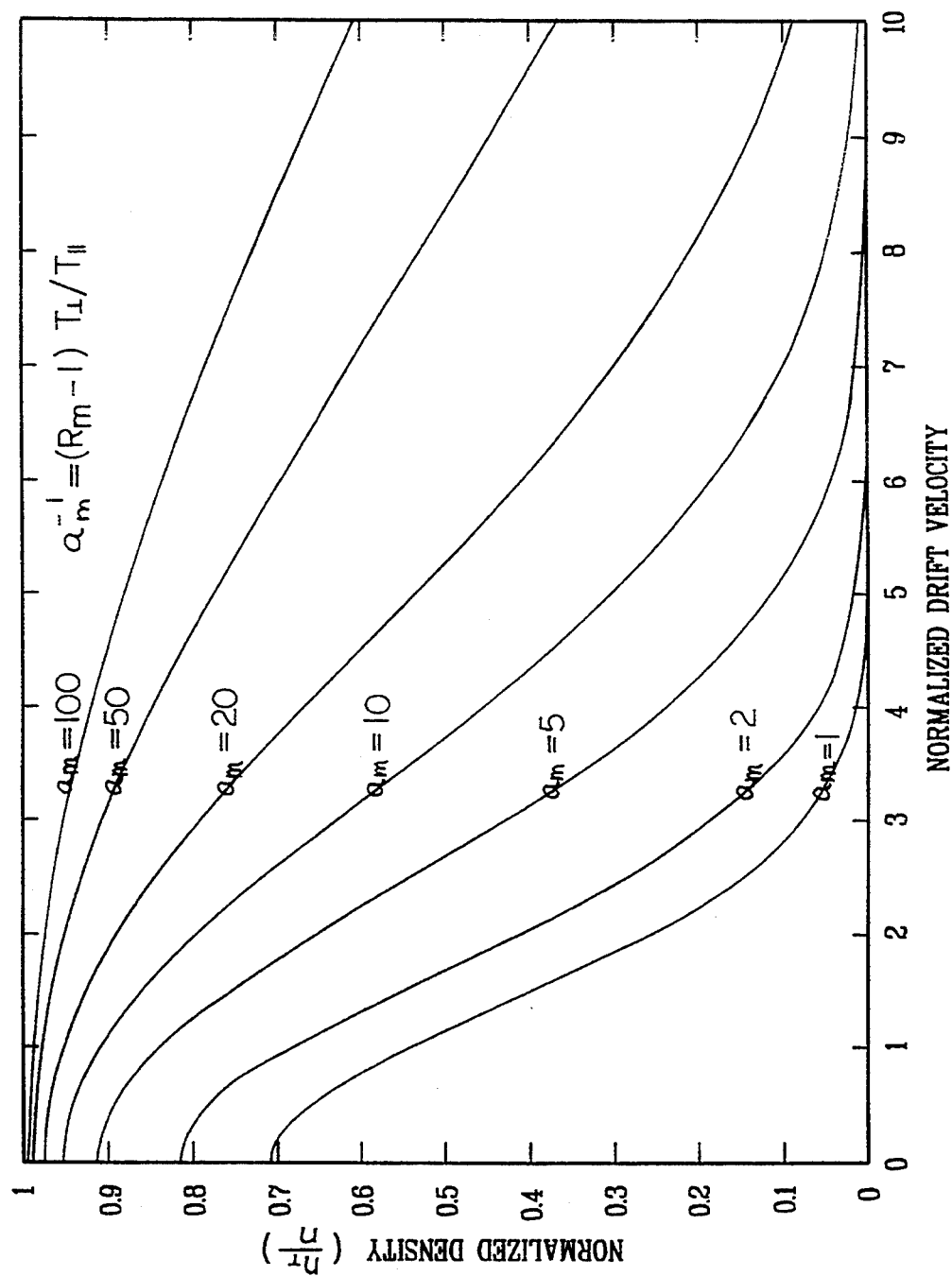
FIG. 2 is a graph of the normalized particle density plotted against the normalized particle drift velocity for various values of velocity component ratios.

Therefore, by adjusting the ratio of the radial to the axial velocity components of the ions of interest (and therefore adjusting the ratio of $T_\perp$ to $T_\mu$), the ions of interest may be selectively retained within a magnetic bottle or selectively permitted to escape the magnetic bottle. Referring to FIG. 2, the normalized trapped ion density (defined as $n_t/n$), is plotted against the normalized drift velocity (($V_{d\mu}$)) for various ratios of ($T_\perp/T_\mu$) ($R_m-1$).

In order to understand the results shown in the graph, consider the case in which ($V_{d\mu}$)=5 and $R_m$=2 (hence $a_m=T_\mu/T_\perp$). Then, for ($T_\perp/T_\mu$) ratios of from 10 to 100 (and hence $a^{-1}{}_m=10\rightarrow100$), the normalized density ranges from 0.3 to 0.9. This indicates that some 30% to 90% of the selected ions having a ratio of perpendicular temperature to parallel temperature, ($T_\perp/T_\mu$), of from 10 to 100 are trapped in the magnetic bottle. Conversely, virtually none of the ions with a ratio of $T_\perp/T_\mu=1$ remain in the magnetic bottle. Thus, by selectively heating the desired ions to ($T_\perp/T_\mu$) ratios <10 and not heating the undesired ions (therefore permitting them to have $T_\perp/T_\mu$ ratio approximately 1), the desired ions can be selectively retained in the magnetic bottle. The present invention utilizes the above relationships to select ions for implantation.

Figure 3:
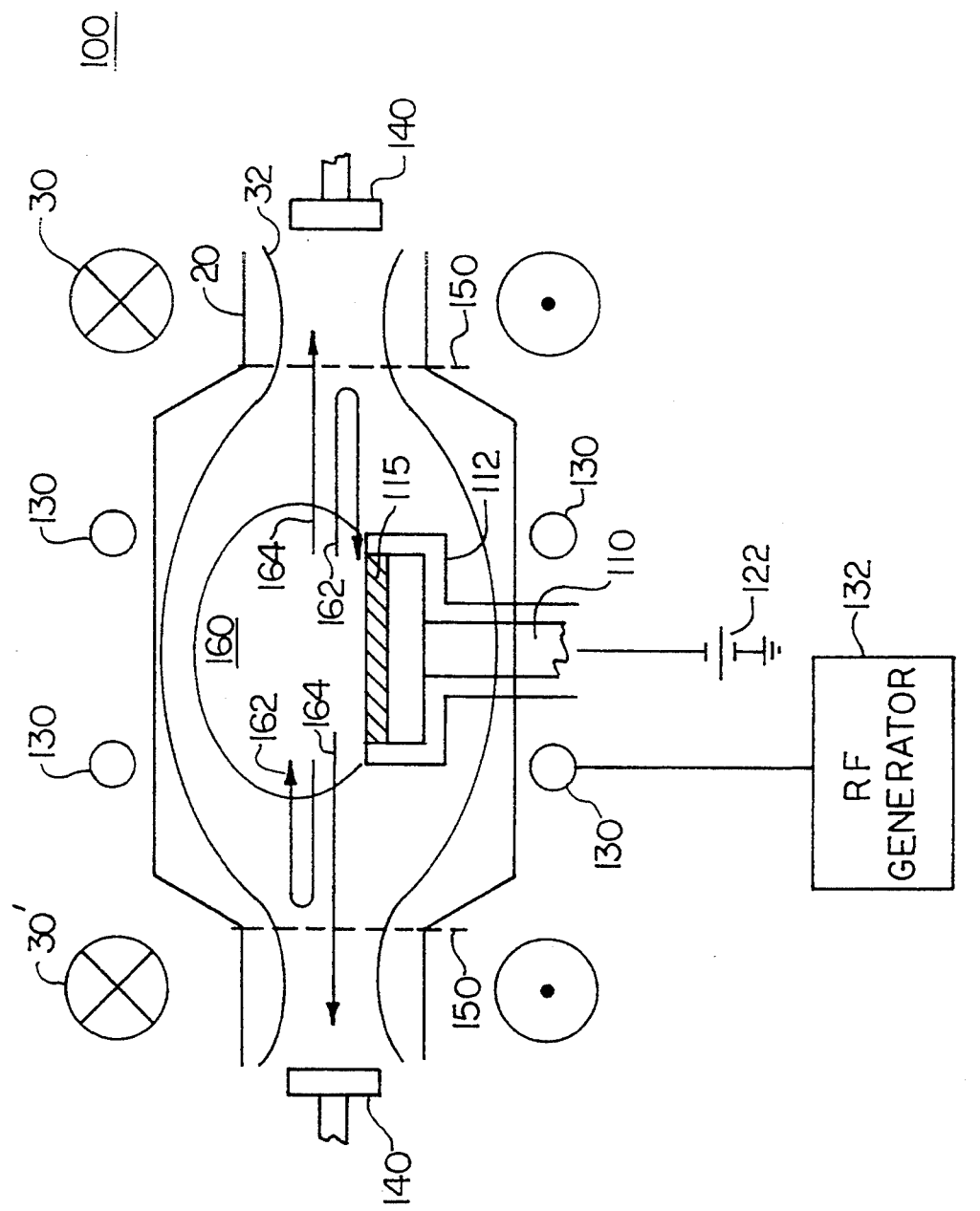
FIG. 3 is an embodiment of the ion implantation apparatus of the invention which retains ions having predefined characteristics within a confinement region within which is placed a wafer to be implanted.

In brief overview, one embodiment of the ion implantation apparatus of the invention, shown in FIG. 3, includes an outer containment vessel 20 having an electromagnetic coil 30, 30' adjacent each end of the outer containment vessel 20. The outer containment vessel 20 is typically made of an appropriate insulator such as quartz or glass. In another embodiment, the outer containment vessel 20 is constructed of a non-ferromagnetic metal, but in such an embodiment, an rf antenna used to heat the plasma (as discussed below) must be placed within the outer containment vessel 20. A direct current passing through the coils 30, 30' (in one embodiment 500 amp-turns) in the same direction causes a magnetic field to be generated between the coils 30, 30' within the outer containment vessel 20.

The magnetic field lines 32, as described previously, are more closely spaced and hence, have a higher density in the regions of the coils 30, 30' than in the regions intermediate the coils 30, 30'. Typically the magnetic field 32 ranges from about 875 gauss adjacent the coils 30, 30' to about 400 gauss midway between the coils for the embodiment described. Thus the magnetic field 32 within the outer containment vessel 20 forms a magnetic bottle for trapping a plasma between the coils 30, 30' within the outer containment vessel 20 as discussed previously. The dimensions of the bottle and the strength of the magnetic field are chosen such that an ion executes about ten gyrations before being reflected at the mirror points. Typically the magnetic bottle is between 0.5 and 1 meter in length for the magnetic field strengths discussed above.

At each end of the external containment vessel 20 is located an ion collector 140. Ion collector 140 is an negatively biased conductor which neutralizes any ions which pass through the mirror. The resulting neutral molecules are then removed from the external containment vessel 20 by a vacuum pump as discussed below. Alternatively, the ion collector may be used in conjunction with an ion analyzer to monitor the selection of ion species.

Within the external containment vessel 20 is located a wafer holder 110 which positions a wafer 115 within the plasma 160 contained within the magnetic bottle. In one embodiment, the wafer holder 110 is constructed from a conductor, such as stainless steel, coated or covered with an insulator 112, such as quartz, and connected to a negative constant DC or pulsed bias voltage source 122 which biases the wafer 115 to a predefined negative potential. The bias electrical potential applied to the wafer holder 110 contributes to the implantation energy of the ions. A bias voltage of between 1–100 kV is normally applied.

In the embodiment shown in FIG. 3, a vacuum pump (not shown) maintains a decreased pressure within the magnetic bottle by applying a vacuum at one or both ends of the containment vessel 20. Alternatively, the vacuum pump can apply a vacuum elsewhere in the containment vessel 20. Similarly, a gas inlet (not shown) for introducing, into the containment vessel 20, a gas which is to be ionized into a plasma is located within the containment vessel 20. Typically such an inlet is located adjacent the region in which the plasma is being created. In one embodiment, a microwave source is used to initially ionize the gas entering the containment vessel 20. In another embodiment an rf antenna is used to generate the plasma.

Adjacent to and external to the outer containment vessel 20 and between the coils 30, 30' is located an ion cyclotron resonance heating (ICRH) antenna 130. The ICRH antenna 130 is connected to a radio frequency generator 132 operating at frequencies approximately in the range of 12.5 to 113 kHz at from approximately 100W to 10 kW of power. The ICRH antenna 130 produces a radio frequency field which causes ions of the plasma to increase their radius of gyration about the magnetic field lines of the magnetic bottle and therefore increases the ions' perpendicular velocity component $v_r$. It should be noted that if a containment vessel 20 of aluminum is used, the ICRH antenna 130 must be located within the containment vessel 20. It should also be noted that if a high power ICRH system is used, the ICRH system may be used to generate the plasma.

In general, as the plasma is heated, ions 162 having a ratio of radial velocity, $v_r$, to axial velocity, $v_a$, greater than or equal to the predetermined value of $(1/(R_m-1))^{\frac{1}{2}}$, as determined by the strength of the magnetic field in the mirror region 150, are reflected by the mirror region 150 back into the magnetic bottle and are constrained to reside within the plasma 160 in the region of the wafer 115. Conversely, ions 164 having a ratio of radial velocity $v_r$ to axial velocity $v_a$ less than the predefined value pass through the mirror regions 150, escape from the magnetic bottle, and are removed from the containment vessel 20. Thus, by selectively heating the ions of interest with a rf field, ions may be selectively retained within the magnetic bottle.

To understand how this may be accomplished, consider that the equation of motion for a single ion is given by the expression:

$$\frac{dv}{dt} = -j\omega_{pi}v + \frac{q}{M}Ee^{-j\omega t}$$

where $v=v_x+jv_y$, $E=E_x+jE_y$ (for a left-circularly polarized rf wave), q is the charge on the ion, $\omega_{pi}$ is the plasma ion angular frequency and $\omega$ is the rf-frequency. $\omega_{pi}$ is defined, for each $j_{th}$ ion species in the plasma, by the equation:

$$\omega_{pi} = \sqrt{\frac{n_j q_j^2}{\epsilon_0 m_j}}$$

where $n_j$ is the refractive index of the $j^{th}$ ion plasma, $q_j$ is the charge of the $j^{th}$ $m_j$ is the mass of the $j^{th}$ ion and $\epsilon_o$ is the permitivity. Therefore solving for v:

$$v = v_0 e^{-j\omega_{pi}t} + \frac{j\frac{q}{M}E}{(\omega - \omega_{pi})}(e^{-j\omega t} - e^{-j\omega_{pi}t})$$

For the whole ion distribution, the square average velocity $<v>$ is given by the expression:

$$<v_\perp^2> = <v_{\perp 0}^2> + 4\frac{e^2|E_\perp|^2}{M^2}\frac{\sin^2\frac{1}{2}(\omega - \omega_{pi})t}{(\omega - \omega_{pi})^2}$$

where $e^2$ is the square of the charge on an electron.

The heating rate (the rate of change of the average kinetic energy of the ions) for a plasma heated using ion cyclotron resonance is given by the expression:

$$\frac{d<\frac{1}{2}Mv_\perp^2>}{dt} = \frac{e^2|E_\perp|^2}{M}\frac{\sin(\omega - \omega_{pi})t}{(\omega - \omega_{pi})}$$

In particular, and as a first approximation, assuming that the E-field within the plasma is approximately equal to the E-field in a vacuum and assuming that the field is linearly polarized, $$\frac{d<\frac{1}{2}Mv_\perp^2>}{dt} = \frac{q^2\mu_0^2 I^2 \omega^2}{2M}F^2(\rho,z)\frac{\sin(\omega - \omega_{pi})t}{(\omega - \omega_{pi})}$$

where $\mu_o$ is the permeability constant, I is the current in the antenna and $F(\rho,z)$ is the distribution function for the electric field generated by the antenna in polar coordinates.

Since the time t it takes an ion to go from its starting position $Z_0$ to location Z is given by the equation $t=(z-z_0)/v_{||}$, the perpendicular kinetic energy of the ions of the plasma is given by the expression:

$$<\frac{1}{2}Mv_\perp^2> = <\frac{1}{2}Mv_{\perp 0}^2> + \frac{q^2\mu_0^2 I^2\omega^2}{2Mv_{||}}\int_{Z_0}^{Z_1}F^2(\rho,z)\frac{\sin[(\omega-\omega_{pi})(z-z_0)/v_{||}]}{(\omega - \omega_{pi})}dz$$

where the plasma source is positioned at $z_0$, and $z_1$ is the location away from the antenna at which the electric field from the antenna is negligible. The antenna is assumed to be located at z=0.

Figure 3A:
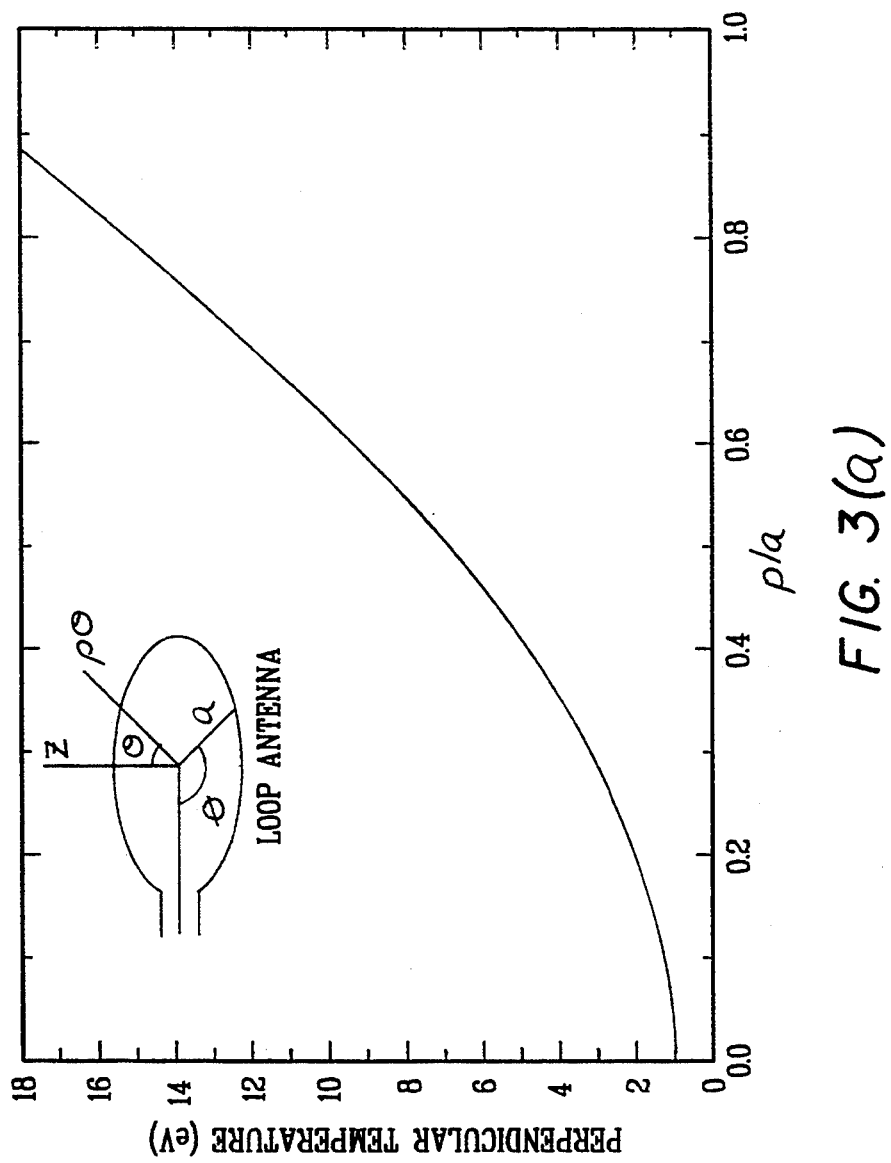
FIG. 3(a) is a graph of the perpendicular temperature plotted against $\rho/a$ for an ion heated using a simple loop ICRH antenna in an 800G magnetic field.
Figure 3B:
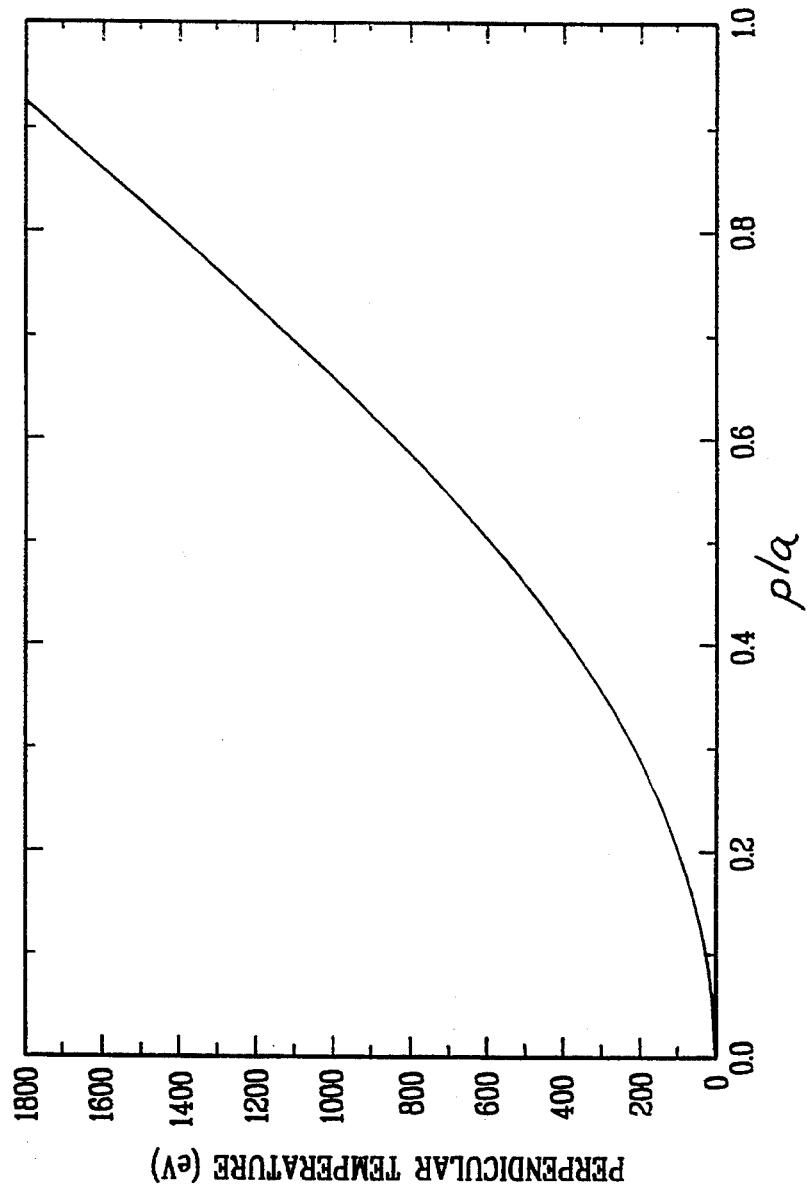
FIG. 3(b) is a graph of the perpendicular temperature plotted against $\rho/a$ for an ion heated using a simple loop ICRH antenna in an 8 kG magnetic field.

For a loop antenna, the function $F(\rho,\theta)$ is given by the expression:

$$F(\rho,\theta) = \frac{a}{2\pi}\int_0^\pi \frac{e^{-j\beta(r^2+a^2-2ra\,SIN\theta COS\phi')^{\frac{1}{2}}}}{(r^2+a^2-2ra\sin\theta\cos\phi')^{\frac{1}{2}}}\cos\phi' d\phi'$$

where a is the radius of the loop antenna, r is the distance to a point in space from the center of the antenna, $\theta$ is the angle measured between r and the z-coordinate perpendicular to the loop antenna, $\phi$ is the azimuthal angle measured between an arbitrary 0° reference point and the point in space and $\beta$ is the propagation constant (FIG. 3a).

Assuming that the magnetic field is uniform near the antenna, and that the rf frequency $\omega$ is equal to the cyclotron angular frequency $\omega_{ci}$ which is given by the expression:

$$\omega_{ci} = |q_j|B_0/m_j$$

Then the increase in the perpendicular component of temperature $(T_\perp)$ as the ion traverses once the rf-field generated by the loop ICRH antenna is given by the expression:

$$T_\perp(eV) = T_{\perp 0}(eV) + \frac{\mu_0^2 I^2\omega_{pi}^2}{4T_{||}(eV)}\int_{Z_0}^{Z_1}F^2(\rho,z)(z-z_0)dz$$

where $T_\perp$ (eV) is the perpendicular temperature in electron volts (eV) of the ion after passing through the ICRH field; $T_{\perp 0}$ (eV) is the initial perpendicular temperature in electron volts (eV) of the ion; I is the current in the antenna, $T_{||}$ (eV) is the parallel temperature of the ion, and $\rho$ is the radial distance to the ion normalized to the radius of the loop antenna. FIG. 3(a) depicts a graph of the single pass increase of the perpendicular temperature of an ion in a 800 G magnetic field plotted against normalized radius $\rho$ for a simple loop antenna carrying a current of 100A. In this example, $T_{||}=T_\perp=0.2$ eV, $z_0=0$ and $z_1=1$. As can be seen, ions nearest the loop antenna have the highest heating rate. FIG. 3 (b) depicts the same plot for a 8 kg magnetic field. Notice that as the magnetic field is increased by a factor of 10, the heating rate is increased by a factor of 100. Other antenna configurations are possible.

Thus, the species of the ions desired for implantation may be selectively modified so that the desired ions are selectively retained within the magnetic bottle to thereby selectively enrich their concentration in the plasma.

Figure 4:
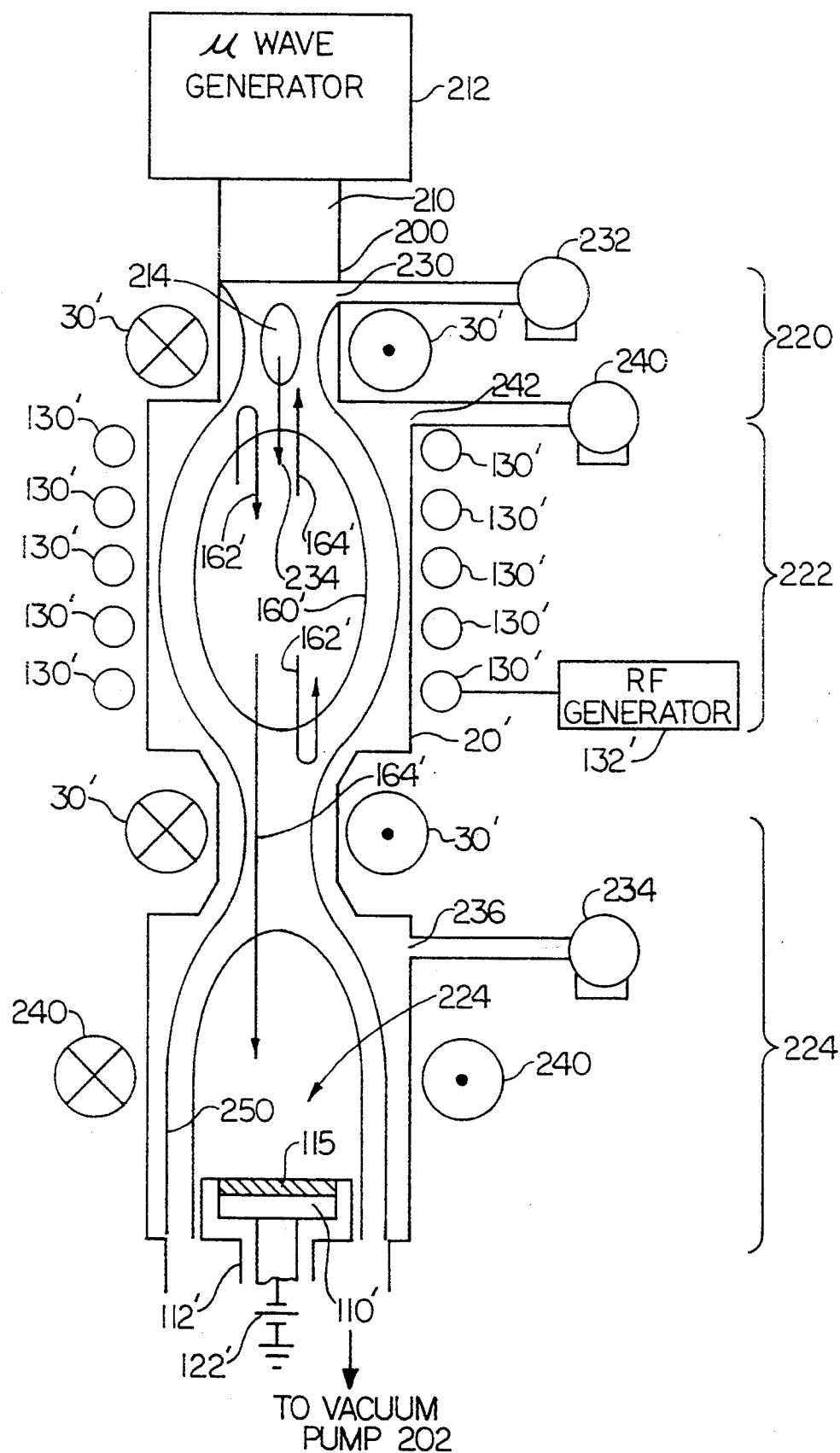
FIG. 4 is another embodiment of the ion implantation apparatus of the invention which permits ions having predefined characteristics to pass from a confinement region to a region within which is positioned a wafer to be implanted.

FIG. 4 depicts another embodiment of the ion implantation apparatus of the invention. In this embodiment an outer containment vessel 20' is constructed of an insulator, such as quartz, or aluminum (coated internally with quartz as described above) and is open at one end to a vacuum pump 202. The outer containment vessel 20 is closed at its other end by a microwave transparent window 200. External to the outer containment vessel 20' and adjacent to the microwave transparent window 200 is a microwave waveguide 210 which transmits microwaves from a 1 KW microwave generator 212 through the microwave transparent window 200 into the interior of the outer containment vessel 20'.

The outer containment vessel 20' may be considered as being divided roughly into three regions. The first region 220, the plasma ionization region, is internal to the outer containment vessel 20' and adjacent to the microwave transparent window 200. In this region, microwaves from the microwave generator 212 ionize the gas 214 introduced from a gas source 232 into the outer containment vessel 20' through a gas inlet 230 adjacent the microwave transparent window 200. The selection of the gas introduced into the containment vessel is determined by what ions are to be implanted. Examples of gases which are used as sources of implantation ions are $BF_3$, $PH_3$, and $B_2H_6$, among others.

The second region 222 of the outer containment vessel 20' is the region between the electromagnetic coils 30, 30' which generate the magnetic field. Ions 234 from the ionized gas 214 move into the region of the magnetic bottle internal to the outer containment vessel 20' and between the magnetic field coils 30, 30'. A differential pump 240, having an inlet 242 adjacent the ionization region 220 is used to remove neutral gas molecules which might otherwise pass from the ionization region 220 into the magnetic bottle region 222. This is done to reduce the ion-neutral particle collisions and minimize the ion drift across the magnetic field lines.

As in the previous embodiment, adjacent to and external to the outer containment vessel 20' is located an ICRH antenna 130', which is connected to an rf generator 132'. This ICRH antenna 130' located between the magnetic field coils 30, 30' produces an rf field which increases the perpendicular temperature of the selected ions in the plasma, as discussed previously. Again, as the plasma is heated, ions 162' having a radial velocity, $v_r$, to axial velocity, $v_a$, ratio greater less than a predetermined value are reflected back into the magnetic bottle and are constrained to reside within the plasma 160'. Ions 164' having a radial velocity, $v_r$, greater than a predefined value as discussed previously escape from the magnetic bottle.

Some of the ions 164', which escape the magnetic bottle, pass into the third region 224' of the outer containment vessel 20', the implantation region. In one embodiment, second differential pump 234 having an input port 236 in the area of the outer containment vessel 20' between the magnetic bottle region 222 and the implantation region 224 again is used to further reduce the density of neutral gas molecules in the implantation region 224. A third electromagnetic coil 240, located external to the outer containment vessel 20' and near the end of the outer containment vessel 20' connected to the vacuum pump 202, makes the magnetic field 250 uniform in the vicinity of the implantation region 224.

A wafer holder 110' is positioned within the outer confinement vessel 20' adjacent the opening to the vacuum pump 202. As in the other embodiment, the conductive wafer holder 110' coated by an insulator 112' positions the wafer 115 within the implantation region 224. The conductive wafer holder 110' is connected to a negative high voltage constant DC or pulse source 122' which electrically biases the conductive wafer holder 110' and hence the wafer 115 to a predefined negative potential. Thus, unlike the previous embodiment (FIG. 3) in which the desired ions are contained within the magnetic bottle in the vicinity of the wafer 115, in this embodiment the desired ions are selected to escape the magnetic bottle and bombard the wafer 115. It should be noted that although only one magnetic bottle is shown in this embodiment, a sequence of magnetic bottles may be concatenated to produce multiple ion selectors and further purify the implantation plasma.

It should also be noted that although the invention has been described in terms of an ion implantation apparatus, with the proper gas mixture, the apparatus may be used to etch rather than implant a wafer. The apparatus may also be used to select ions for deposition.

Figure 5A:
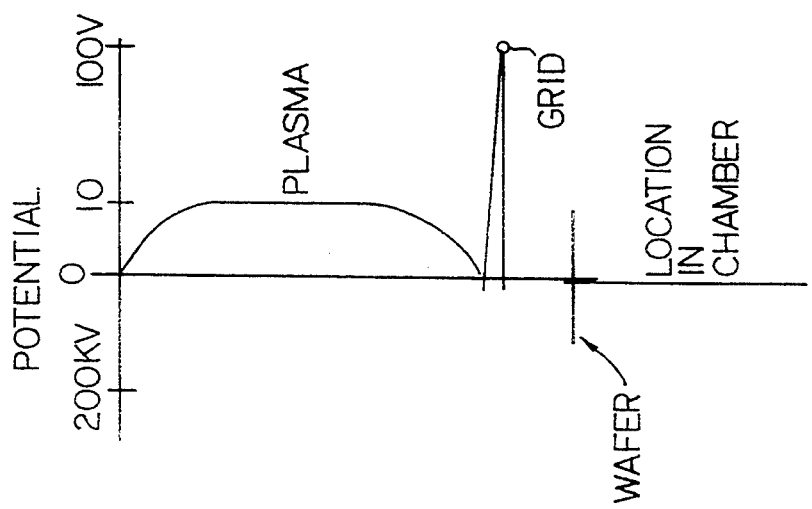
FIG. 5a is a graph of the potential on the various structures of the ion implantation apparatus of FIG. 5.
Figure 5:
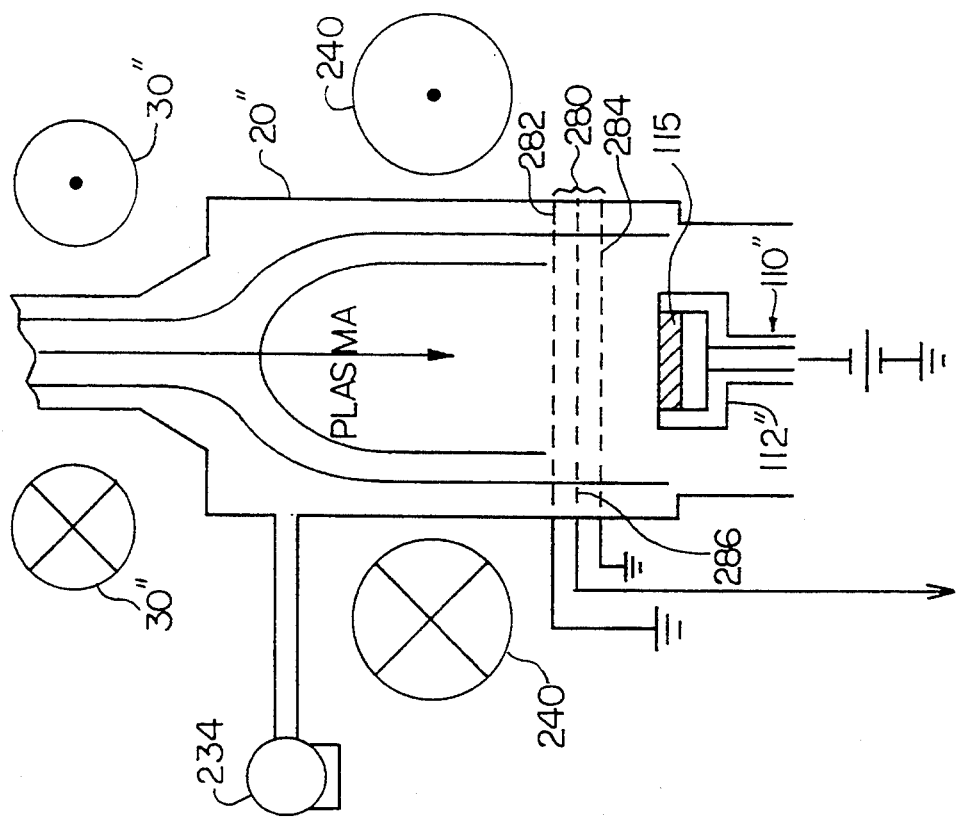
FIG. 5 is an embodiment of the ion implantation apparatus of FIG. 3, including an electrostatic grid.

FIG. 5 depicts a portion of another embodiment of the implantation apparatus. This embodiment, which is depicted in conjunction with the embodiment of FIG. 4 (only the implantation region 224' being shown) utilizes an electrostatic grid assembly 280 located between the plasma and the substrate holder 110''. In this embodiment, the substrate holder 110'' is maintained at a large negative voltage relative to the plasma. Such a voltage is typically from $-1$ kV to $-200$ kV. The electrostatic grid assembly 280 includes three individual grids. The grid 282 nearest the plasma is held at 0V as is the as is the grid 284 nearest the wafer. The intermediate grid 286 is connected to electronic grid electronics which periodically switches the intermediate grid 286 between a positive voltage greater than the source plasma potential, for example $+100V$, and 0V causing the intermediate grid 286 to act as an electrostatic shutter.

When the intermediate grid 286 is at $+100V$, or any positive voltage greater than the source plasma potential, the positive ions of the plasma are repelled and do not reach the wafer 115. When the intermediate grid 286 is set to 0V, the positive ions of the plasma experience the large negative potential at which the wafer holder 110'' is being held. These positive ions then are simultaneously accelerated by the potential and implant in the substrate 115 at depth determined by the potential of the wafer 115. FIG. 5a depicts the relative voltages on the various components of the ion implantation apparatus.

Thus it is possible to select positive ions for such processes as SiOx and deposit them to a predetermined depth. It should be noted that it is possible to use the electrostatic grid in any plasma immersion apparatus to select the depth to which ions are to be implanted and not just plasma immersion apparatuses utilizing magnetic bottles.

Having shown the preferred embodiment, those skilled in the art will realize many variations are possible which will still be within the scope and spirit of the claimed invention. Therefore, it is the intention to limit the invention only as indicated by the scope of the claims.

What is claimed is:

1. An ion implantation apparatus comprising:
   a magnetic bottle for selectively retaining ions;
   an ion cyclotron resonant frequency device for selectively heating ions retained within said magnetic bottle thereby permitting ions having predetermined characteristics to escape from said magnetic bottle; and
   a wafer holder positioned to expose a wafer to ions selectively retained within said magnetic bottle.

2. The apparatus of claim 1 wherein said wafer holder comprises a conductor coated with an insulator.

3. The apparatus of claim 2 wherein said wafer holder is biased by a predefined negative potential.

4. The apparatus of claim 3 wherein said predefined negative potential is provided by a constant DC source.

5. The apparatus of claim 3 wherein said predefined negative potential is provided by a pulsed source.

6. The apparatus of claim 1 further comprising at least one ion collector positioned adjacent said magnetic bottle to remove ions which escape from said magnetic bottle.

7. The apparatus of claim 1 wherein said magnetic bottle is located within a an outer containment chamber.

8. The apparatus of claim 7 wherein said ion cyclotron resonant frequency device comprises an ion cyclotron resonant antenna and a radio frequency generator.

9. The apparatus of claim 8 wherein said ion cyclotron resonant antenna is located external to said outer containment chamber.

10. The apparatus of claim 8 wherein said ion cyclotron resonant antenna is located within said outer containment chamber.

11. The apparatus of claim 1 further comprising a plasma generating device for generating said ions within said magnetic bottle.

12. An ion implantation apparatus comprising:
a magnetic bottle for selectively retaining ions;
an ion cyclotron resonant frequency device for selectively heating ions retained within the magnetic bottle thereby permitting ions having predetermined characteristics to escape from said magnetic bottle; and
a wafer holder positioned to expose a wafer to ions which escape from the magnetic bottle.

13. The apparatus of claim 12 wherein said wafer holder comprises a conductor coated with an insulator.

14. The apparatus of claim 13 wherein said wafer holder is biased by a predefined negative potential.

15. The apparatus of claim 14 wherein said predefined negative potential is provided by a constant DC source.

16. The apparatus of claim 14 wherein said predefined negative potential is provided by a pulsed source.

17. The apparatus of claim 12 wherein said magnetic bottle is located within a an outer containment chamber.

18. The apparatus of claim 17 wherein said ion cyclotron resonant frequency device comprises a ion cyclotron resonant antenna and a radio frequency generator.

19. The apparatus of claim 18 wherein said ion cyclotron resonant antenna is located external to said outer containment chamber.

20. The apparatus of claim 19 wherein said ion cyclotron resonant antenna is located within said outer containment chamber.

21. The apparatus of claim 12 further comprising at least one additional electromagnet positioned to provide a uniform magnetic field in the vicinity of said wafer holder.

22. The apparatus of claim 12 further comprising a plasma generating device for generating said ions within said magnetic bottle.

23. A method for ion implantation comprising:
selectively retaining ions within a magnetic bottle;
selectively heating ions retained within the magnetic bottle with an ion cyclotron resonant frequency device, thereby permitting ions having predetermined characteristics to escape from said magnetic bottle; and
exposing a wafer to ions selectively retained within said magnetic bottle.

24. A method of ion implantation comprising:
selectively retaining ions within a magnetic bottle;
selectively heating ions retained within the magnetic bottle with an ion cyclotron resonant frequency device, thereby permitting ions having predetermined characteristics to escape from said magnetic bottle; and
exposing a wafer selectively to ions which escape from the magnetic bottle.

* * * * *

UNITED STATES PATENT AND TRADEMARK OFFICE
CERTIFICATE OF CORRECTION

PATENT NO. : 5,442,185
DATED : August 15, 1995
INVENTOR(S) : Chung Chan

Page 1 of 2

It is certified that error appears in the above-indentified patent and that said Letters Patent is hereby corrected as shown below:

Column 4, line 25, "where $V_p$ is defined" should read --where $V_o$ is defined--.

Column 4, line 26, "$V_2^2 = V_a^2 + V_r^2)B_o$" should read --$V_o^2 = V_a^2 + V_r^2)$; $B_o$--.

Column 4, line 29, "$R_m$." should read --$R_m$--.

Column 4, line 42, "$T_\mu$" (parallel temperature)" should read --$T_\parallel$ (parallel temperature)--.

Column 4, line 48, "$V_{d\mu}$" should read --$V_{d\parallel}$--.

Column 4, line 69, "where $(V_{d\mu})$" should read --where $\langle V_{d\parallel} \rangle$--.

Column 5, line 3, "$T_\perp/T\mu$" should read --$(T_\perp/T_\parallel)$--.

Column 5, line 8, "$((V_{d\mu}))$" should read --$(\langle V_{d\parallel} \rangle)$--.

Column 5, line 8, "$T_\perp/T\mu$" should read --$T_\perp/T_\parallel$--.

Column 5, line 11, "$(V_{d\mu})$" should read --$\langle V_{d\parallel} \rangle$--.

Column 5, line 12, "$a_m=T_\mu/T_\perp)$" should read --$a_m=T_\parallel/T_\perp)$--.

Column 5, line 12, "$(T_\perp/T_\mu)$" should read --$(T_\perp/T_\parallel)$--.

Column 5, line 16, "$(T_\perp/T_\mu)$" should read --$(T_\perp/T_\parallel)$--.

Column 5, line 19, "$T_\perp/T_\mu=1$" should read --$T_\perp/T_\parallel=1$--.

UNITED STATES PATENT AND TRADEMARK OFFICE
CERTIFICATE OF CORRECTION

PATENT NO. : 5,442,185
DATED : August 15, 1995
INVENTOR(S) : Chung Chan

It is certified that error appears in the above-indentified patent and that said Letters Patent is hereby corrected as shown below:

Column 5, line 20, "$(T_\perp/T_\mu)$ ratios $\langle$ 10" should read --$(T_\perp/T_\parallel)$ ratios $\rangle$ 10--.

Column 5, line 22, "$T_\perp/T_\mu$" should read --$T_\perp/T_\parallel$--.

Column 7, line 9, "$J^{th}m_j$" should read --$J^{th}$ion, $m_j$--.

Signed and Sealed this

Twentieth Day of August, 1996

Attest:

BRUCE LEHMAN

*Attesting Officer*   *Commissioner of Patents and Trademarks*